(12) United States Patent
Wang et al.

(10) Patent No.: US 12,464,778 B2
(45) Date of Patent: Nov. 4, 2025

(54) METAL-OXIDE THIN-FILM TRANSISTOR, ARRAY BASE PLATE AND FABRICATING METHOD THEREOF

(71) Applicant: BOE Technology Group Co., Ltd., Beijing (CN)

(72) Inventors: Dongfang Wang, Beijing (CN); Lizhong Wang, Beijing (CN); Ce Ning, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/919,387

(22) PCT Filed: Nov. 29, 2021

(86) PCT No.: PCT/CN2021/134039
§ 371 (c)(1),
(2) Date: Oct. 17, 2022

(87) PCT Pub. No.: WO2023/092562
PCT Pub. Date: Jun. 1, 2023

(65) Prior Publication Data
US 2024/0297256 A1 Sep. 5, 2024

(51) Int. Cl.
*H10D 30/67* (2025.01)
*H10D 30/01* (2025.01)

(52) U.S. Cl.
CPC ..... *H10D 30/6755* (2025.01); *H10D 30/0321* (2025.01); *H10D 30/6723* (2025.01)

(58) Field of Classification Search
CPC ........... H10D 30/6755; H10D 30/0321; H10D 30/6723; H10D 30/021; H10D 30/67;
(Continued)

(56) References Cited

U.S. PATENT DOCUMENTS

2010/0176383 A1* 7/2010 Park ................ H10D 86/60
438/46
2014/0034947 A1 2/2014 Moriguchi et al.
(Continued)

FOREIGN PATENT DOCUMENTS

| CN | 103477441 A | 12/2013 |
| CN | 104300007 A | 1/2015 |

(Continued)

*Primary Examiner* — Yasser A Abdelaziz
(74) *Attorney, Agent, or Firm* — IPro, PLLC

(57) ABSTRACT

An array base plate includes a substrate; and a driving transistor and a switching transistor that are located on the substrate; the driving transistor includes a semiconductor layer; the switching transistor includes an active layer and a protecting layer, and the active layer includes two opposite main surfaces and a side surface that is located between outer contours of the two main surfaces; the protecting layer is located on a main surface of the active layer that is away from the substrate and covers the main surface and the side surface; the protecting layer and the semiconductor layer are arranged in a same layer, and a material of the protecting layer and a material of the semiconductor layer are a same metal-oxide-semiconductor material; and a carrier mobility of the protecting layer is less than a carrier mobility of the active layer.

17 Claims, 7 Drawing Sheets

(58) Field of Classification Search
CPC .... H10D 86/00; H10D 86/423; H10D 86/451; H10D 86/60
See application file for complete search history.

(56) References Cited

U.S. PATENT DOCUMENTS

2017/0309649 A1    10/2017  Hayashi
2019/0035937 A1*   1/2019   Yamazaki .......... H10D 30/6755
2019/0148558 A1    5/2019   Suzuki et al.
2021/0135144 A1    5/2021   Zhang et al.

FOREIGN PATENT DOCUMENTS

CN    109786468 A    5/2019
CN    110010626 A    7/2019

* cited by examiner

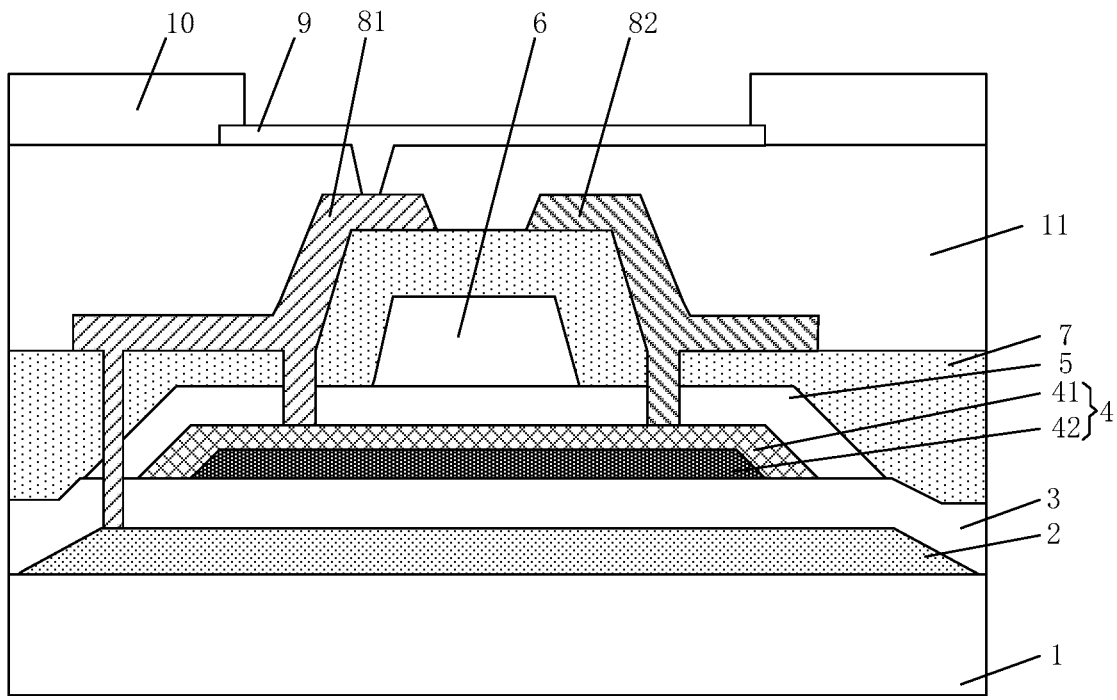

FIG. 6

901 — providing a substrate

902 — forming an active layer of a switching transistor, wherein the active layer comprises two opposite main surfaces and a side surface that is located between outer contours of the two main surfaces 903 — forming a semiconductor layer of a driving transistor and a protecting layer of the switching transistor; wherein the protecting layer is located on a main surface of the active layer that is away from the substrate and covers the main surface and the side surface; the protecting layer and the semiconductor layer are arranged in a same layer, and a material of the protecting layer and a material of the semiconductor layer are a same metal-oxide-semiconductor material; and a carrier mobility of the protecting layer is less than a carrier mobility of the active layer

FIG. 7

METAL-OXIDE THIN-FILM TRANSISTOR, ARRAY BASE PLATE AND FABRICATING METHOD THEREOF

TECHNICAL FIELD

The present disclosure relates to the technical field of displaying, and particularly relates to a metal-oxide thin-film transistor, an array base plate and a fabricating method thereof.

BACKGROUND

With the rapid development of the displaying technique, high-mobility oxide semiconductor materials are increasingly applied in thin-film transistors. For example, the mobility exceeds 5 $cm^2/Vs$, or the mobility exceeds 10 $cm^2/Vs$, or the mobility exceeds 20 $cm^2/Vs$ and reaches 30 $cm^2/Vs$-50 $cm^2/Vs$. The thin-film transistors that are fabricated by using high-mobility oxide semiconductor materials have many advantages such as a high response speed, a low driving voltage and a low power consumption.

However, since the higher the mobility of the semiconductor layer of a transistor fabricated by using oxide semiconductor materials, the poorer the stability, and it is more difficult to control. Usually a metal-oxide semiconductor layer of a multilayer structure is used to improve the stability. Because the multiple layers of the metal-oxide semiconductor layer have different materials or different film-layer qualities, when the same etching agent is used to etch the morphologies of their side faces, an undercut is readily formed, which easily results in a double-channel effect.

SUMMARY

In the first aspect, an embodiment of the present disclosure provides an array base plate, wherein the array base plate includes:
  a substrate; and
  a driving transistor and a switching transistor that are located on the substrate;
  the driving transistor includes a semiconductor layer;
  the switching transistor includes an active layer and a protecting layer, and the active layer includes two opposite main surfaces and a side surface that is located between outer contours of the two main surfaces;
  the protecting layer is located on a main surface of the active layer that is away from the substrate and covers the main surface and the side surface;
  the protecting layer and the semiconductor layer are arranged in a same layer, and a material of the protecting layer and a material of the semiconductor layer are a same metal-oxide-semiconductor material; and
  a carrier mobility of the protecting layer is less than a carrier mobility of the active layer.

In some embodiments of the present disclosure, the material of the protecting layer and a material of the active layer include metal elements that are at least not totally the same; or
  the material of the protecting layer and a material of the active layer have metal-element molar ratios that are at least not totally the same.

In some embodiments of the present disclosure, the switching transistor includes a grid and a grid insulating layer; and the grid insulating layer is located on one side of the protecting layer that is away from the active layer, the grid is located on one side of the grid insulating layer that is away from the substrate, and an orthographic projection of the grid on the substrate is located within an orthographic projection of the active layer on the substrate.

In some embodiments of the present disclosure, the switching transistor further includes a source and a drain;
  both of the source and the drain are located on the side of the grid insulating layer that is away from the substrate;
  the switching transistor is provided with a first connecting hole penetrating the film layers between the source and the protecting layer, and a second connecting hole penetrating the film layers between the drain and the protecting layer, and a hole bottom of the first connecting hole and a hole bottom of the second connecting hole individually expose part of an area of the protecting layer; and
  the source directly contacts the protecting layer via the first connecting hole, and the drain directly contacts the protecting layer via the second connecting hole.

In some embodiments of the present disclosure, the switching transistor further includes a source and a drain;
  both of the source and the drain are located on the side of the grid insulating layer that is away from the substrate;
  the switching transistor is provided with a first connecting hole penetrating the film layers between the source and the active layer, and a second connecting hole penetrating the film layers between the drain and the active layer, a hole bottom of the first connecting hole and a hole bottom of the second connecting hole individually expose part of an area of the active layer, and a hole wall of the first connecting hole and a hole wall of the second connecting hole individually expose part of an area of the protecting layer; and
  the source directly contacts both of the protecting layer and the active layer via the first connecting hole, and the drain directly contacts both of the protecting layer and the active layer via the second connecting hole.

In some embodiments of the present disclosure, a material of the grid insulating layer is a light shielding material, and an orthographic projection of the protecting layer on the substrate is located within an orthographic projection of the grid insulating layer on the substrate.

In some embodiments of the present disclosure, the switching transistor further includes a light shielding layer, the light shielding layer is located between the substrate and the active layer, an orthographic projection of the light shielding layer on the substrate covers the orthographic projection of the active layer on the substrate, and the orthographic projection of the light shielding layer on the substrate covers an orthographic projection of the protecting layer on the substrate.

In some embodiments of the present disclosure, the light shielding layer and the grid are electrically connected.

In some embodiments of the present disclosure, the switching transistor further includes a dielectric layer, the dielectric layer covers the grid, and both of the source and the drain are located on one side of the dielectric layer that is away from the substrate; and
  a material of the dielectric layer is a light shielding material, and an orthographic projection of the dielectric layer on the substrate covers an orthographic projection of the protecting layer on the substrate.

In the second aspect, an embodiment of the present disclosure provides a metal-oxide thin-film transistor, located on a substrate, wherein the metal-oxide thin-film transistor includes:

an active layer located on the substrate, wherein the active layer includes two opposite main surfaces and a side surface that is located between outer contours of the two main surfaces; and a protecting layer, wherein the protecting layer is located on a main surface of the active layer that is away from the substrate and covers the main surface and the side surface; and a material of the protecting layer is a metal-oxide-semiconductor material, and a carrier mobility of the protecting layer is less than a carrier mobility of the active layer.

In some embodiments of the present disclosure, the material of the protecting layer and a material of the active layer include metal elements that are at least not totally the same; or the material of the protecting layer and a material of the active layer have metal-element molar ratios that are at least not totally the same.

In some embodiments of the present disclosure, the metal-oxide thin-film transistor further includes a grid and a grid insulating layer; and the grid insulating layer is located on one side of the protecting layer that is away from the active layer, the grid is located on one side of the grid insulating layer that is away from the substrate, and an orthographic projection of the grid on the substrate is located within an orthographic projection of the active layer on the substrate.

In some embodiments of the present disclosure, the metal-oxide thin-film transistor further includes a source and a drain:

both of the source and the drain are located on the side of the grid insulating layer that is away from the substrate;

the metal-oxide thin-film transistor is provided with a first connecting hole penetrating the film layers between the source and the protecting layer, and a second connecting hole penetrating the film layers between the drain and the protecting layer, and a hole bottom of the first connecting hole and a hole bottom of the second connecting hole individually expose part of an area of the protecting layer; and the source directly contacts the protecting layer via the first connecting hole, and the drain directly contacts the protecting layer via the second connecting hole.

In some embodiments of the present disclosure, the metal-oxide thin-film transistor further includes a source and a drain;

both of the source and the drain are located on the side of the grid insulating layer that is away from the substrate;

the metal-oxide thin-film transistor has a first connecting hole penetrating the film layers between the source and the active layer, and a second connecting hole penetrating the film layers between the drain and the active layer, a hole bottom of the first connecting hole and a hole bottom of the second connecting hole individually expose part of an area of the active layer, and a hole wall of the first connecting hole and a hole wall of the second connecting hole individually expose part of an area of the protecting layer; and the source directly contacts both of the protecting layer and the active layer via the first connecting hole, and the drain directly contacts both of the protecting layer and the active layer via the second connecting hole.

In some embodiments of the present disclosure, a material of the grid insulating layer is a light shielding material, and an orthographic projection of the protecting layer on the substrate is located within an orthographic projection of the grid insulating layer on the substrate.

In some embodiments of the present disclosure, the metal-oxide thin-film transistor further includes a light shielding layer, the light shielding layer is located between the substrate and the active layer, an orthographic projection of the light shielding layer on the substrate covers the orthographic projection of the active layer on the substrate, and the orthographic projection of the light shielding layer on the substrate covers an orthographic projection of the protecting layer on the substrate.

In some embodiments of the present disclosure, the light shielding layer and the grid are electrically connected.

In some embodiments of the present disclosure, the metal-oxide thin-film transistor further includes a dielectric layer, the dielectric layer covers the grid, and both of the source and the drain are located on one side of the dielectric layer that is away from the substrate; and a material of the dielectric layer is a light shielding material, and an orthographic projection of the dielectric layer on the substrate covers an orthographic projection of the protecting layer on the substrate.

In the third aspect, an embodiment of the present disclosure provides a method for fabricating an array base plate, wherein the method includes:

providing a substrate;

forming an active layer of a switching transistor, wherein the active layer includes two opposite main surfaces and a side surface that is located between outer contours of the two main surfaces; and forming a semiconductor layer of a driving transistor and a protecting layer of the switching transistor at the same time;

wherein the protecting layer is located on a main surface of the active layer that is away from the substrate and covers the main surface and the side surface;

the protecting layer and the semiconductor layer are arranged in a same layer, and a material of the protecting layer and a material of the semiconductor layer are a same metal-oxide-semiconductor material; and a carrier mobility of the protecting layer is less than a carrier mobility of the active layer.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

FIG. 3a.

FIG. 5a. FIG. 5b and FIG. 6 are schematic structural diagrams of three array base plates according to embodiments of the present disclosure;

FIG. 7 is a flow chart of the method for fabricating an array base plate according to an embodiment of the present disclosure.

DETAILED DESCRIPTION

Figure 1:
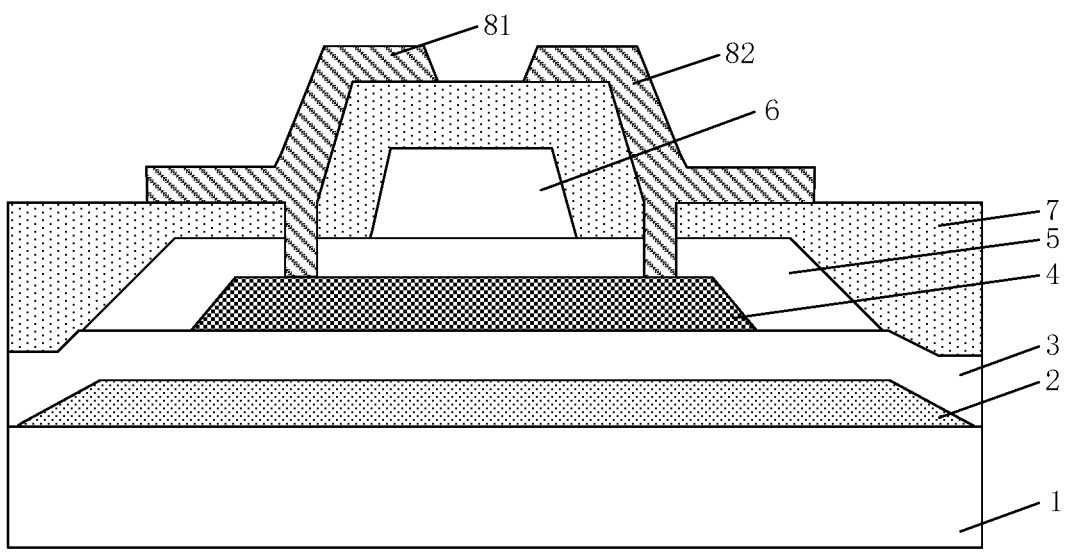
FIG. 1 and FIG. 2 are schematic structural diagrams of two transistors in the related art according to embodiments of the present disclosure.

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the drawings, in order for clarity, the thicknesses of the regions and the layers might be exaggerated. In the drawings, the same reference numbers represent the same or similar components, and therefore the detailed description on them are omitted. Moreover, the drawings are merely schematic illustrations of the present disclosure, and are not necessarily drawn to scale.

Unless stated otherwise in the context, throughout the description and the claims, the term "include" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are included in at least one embodiment or example of the present disclosure. The illustrative indication of the above terms does not necessarily refer to the same embodiment or example. Moreover, the specific features, structures, materials or characteristics may be included in any one or more embodiments or examples in any suitable manner.

In the embodiments of the present disclosure, terms such as "first" and "second" are used to distinguish identical items or similar items that have substantially the same functions and effects, merely in order to clearly describe the technical solutions of the embodiments of the present disclosure, and should not be construed as indicating or implying the degrees of importance or implicitly indicating the quantity of the specified technical features.

Metal oxides, such as Indium Gallium Zinc Oxide (IGZO) and Indium Tin Zinc Oxide (ITZO), may serve as the material of the semiconductor layer of thin-film transistors. As compared with amorphous-silicon thin-film transistors, the carrier concentration of metal-oxide thin-film transistors is approximately ten times that of the amorphous-silicon thin-film transistors, and the carrier mobility is 20-30 times that of the amorphous-silicon thin-film transistors. Therefore, the metal-oxide thin-film transistors can greatly increase the rates of charging and discharging of the thin-film transistors to pixel electrodes, to increase the response speed of the pixels, to in turn realize a higher refresh rate.

Figure 2:
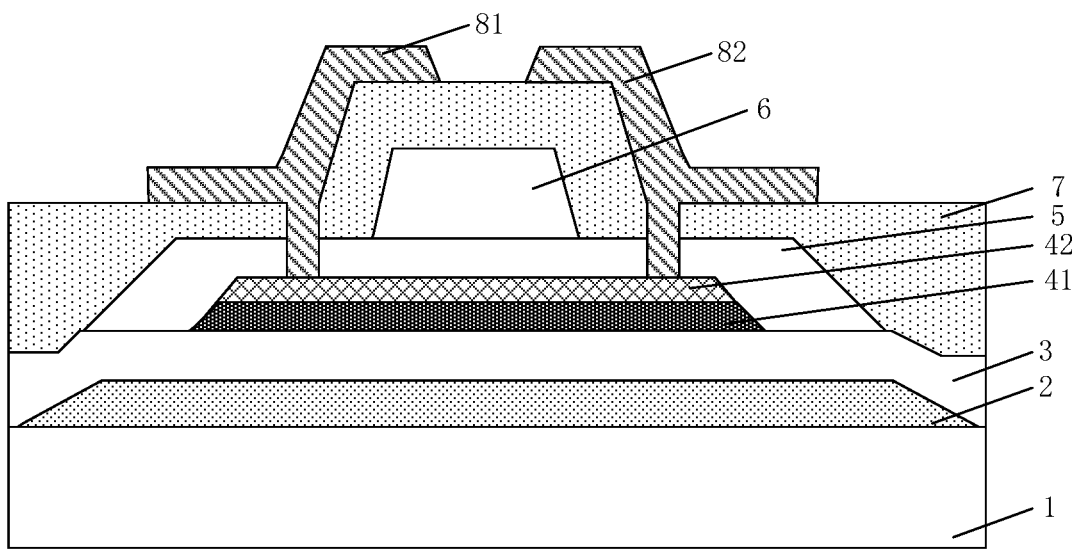

In the thin-film transistors in the related art, the monolayer metal-oxide semiconductor layer 4 shown in FIG. 1 may be provided, or the double-layer metal-oxide semiconductor layer 41, 42 shown in FIG. 2 may be provided. However, in an aspect, for the semiconductor material, the higher the carrier mobility of the semiconductor material, the poorer the stability of the material. In another aspect, the thin-film transistors with the monolayer semiconductor layer (metal oxide or amorphous silicon) cannot satisfy the usage demand of the various types of high-performance display products currently. In practical applications, when a metal-oxide-semiconductor material is used as the material of the semiconductor layer of the thin-film transistors, for the thin-film transistors having a double-layer metal-oxide semiconductor layer, the process of etching the upper layer of the metal-oxide semiconductor layer very easily causes damage on the bottom layer of the metal-oxide semiconductor layer. In addition, because the semiconductor layers with different carrier mobilities are etched by using the same etching agent, defects are more easily formed on the side faces of the semiconductor layer with the higher carrier mobility, which deteriorates the usage performance of the metal-oxide thin-film transistors to a large extent.

Figure 5A:
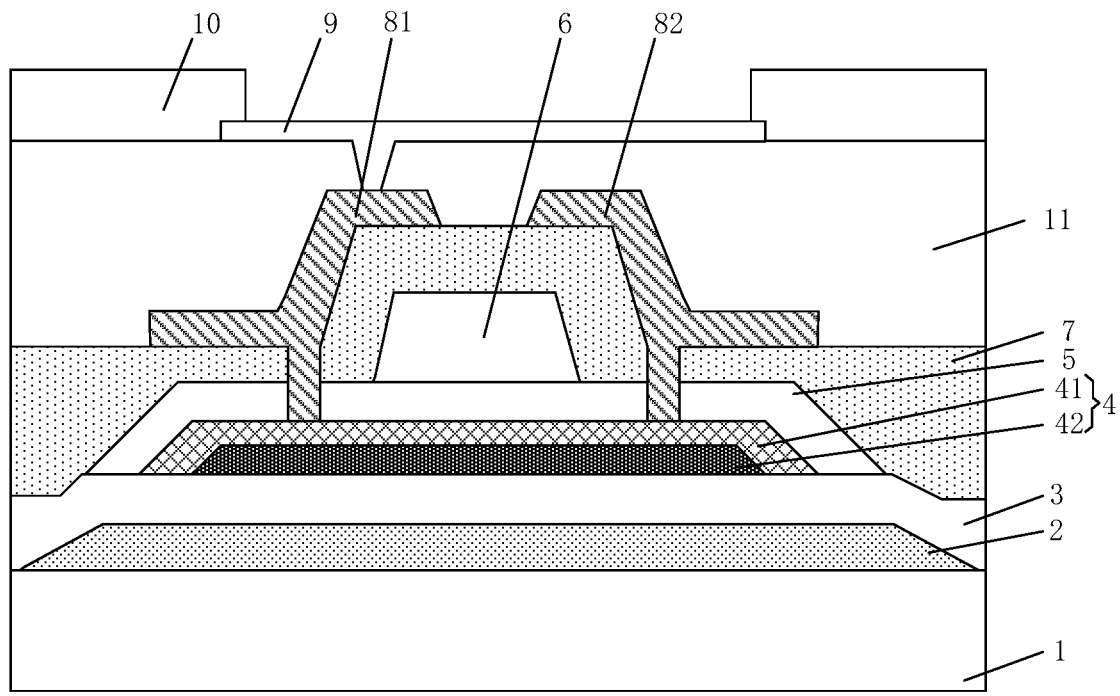
Figure 5B:
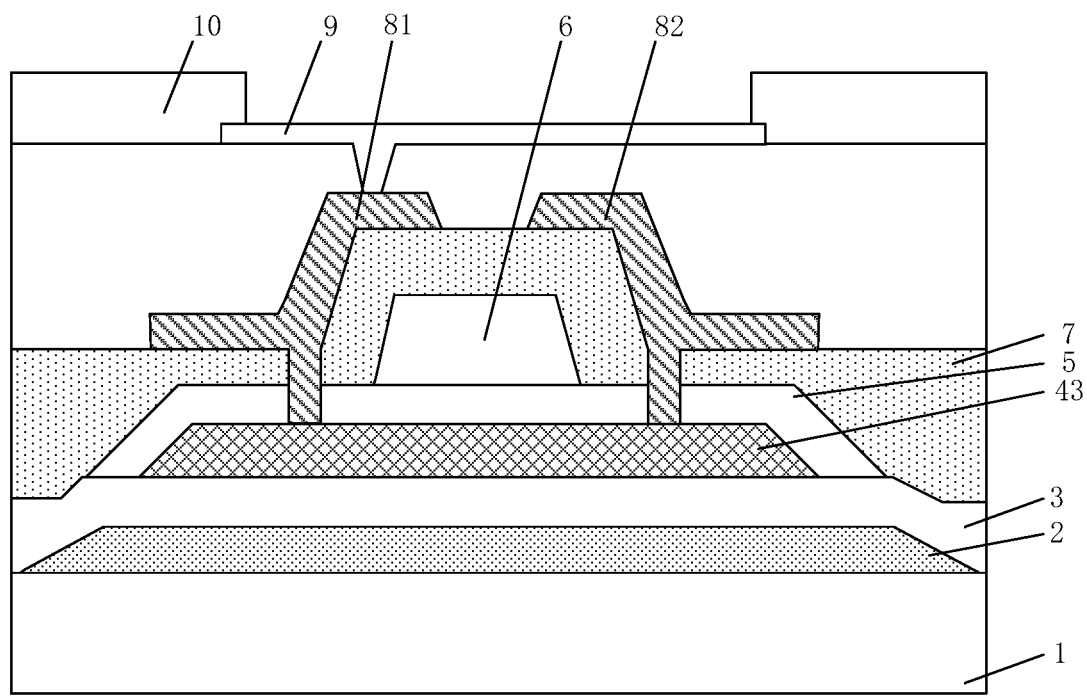

In view of that, an embodiment of the present disclosure provides an array base plate, wherein the array base plate includes:

a substrate 1; and a driving transistor shown in the array base plate of FIG. 5b and a switching transistor shown in the array base plate of FIG. 5a that are located on the substrate 1.

The driving transistor includes a semiconductor layer 43. The switching transistor includes an active layer 42 and a protecting layer 41, and the active layer 42 includes two opposite main surfaces and a side surface that is located between the outer contours of the two main surfaces.

The protecting layer 41 is located on a main surface of the active layer 42 that is away from the substrate 1 and covers the main surface and the side surface. The protecting layer 41 and the semiconductor layer 43 are arranged in a same layer, and the material of the protecting layer and the material of the semiconductor layer are the same metal-oxide-semiconductor material. The carrier mobility of the protecting layer 41 is less than the carrier mobility of the active layer 42.

In an exemplary embodiment, the materials of the protecting layer 41 and the active layer 42 are different. For example, the materials of the protecting layer 41 and the active layer 42 may be any one type of metal oxides such as Indium Gallium Zinc Oxide (IGZO) or Indium Tin Zinc Oxide (ITZO).

As an example, both of the materials of the protecting layer 41 and the active layer 42 may be the Indium Tin Zinc Oxide, but the composition ratios of the elements corresponding to them are at least partially different.

In some embodiments of the present disclosure, when the carrier mobility of the protecting layer 41 is less than the carrier mobility of the active layer 42, the material of the protecting layer 41 and the material of the active layer 42 include metal elements that are at least not totally the same. For example, the material of the protecting layer 41 is the Indium Gallium Zinc Oxide, and the material of the active layer 42 is the Indium Tin Zinc Oxide.

In some embodiments of the present disclosure, when the carrier mobility of the protecting layer 41 is less than the carrier mobility of the active layer 42, the material of the protecting layer 41 and the material of the active layer 42 have metal-element molar ratios that are at least not totally the same. For example, the material of the active layer 42 is the Indium Gallium Zinc Oxide, wherein the molar ratio of the indium, gallium, zinc and oxygen is 3:1:3:9, and the carrier mobility corresponding to it is greater than or equal to 40 cm$^2$/Vs. The material of the protecting layer 41 is the Indium Gallium Zinc Oxide, wherein the molar ratio of the indium, gallium, zinc and oxygen is 3:3:3:12, and the carrier mobility corresponding to it is 10 cm$^2$/Vs.

It should be noted that the meaning of the "at least not totally the same" is "partially the same or totally different".

In an exemplary embodiment, the thicknesses of the active layer 42 and the protecting layer 41 in the direction perpendicular to the substrate may range from 10 nm to 80 nm, and the thickness of the protecting layer 41 in the direction perpendicular to the side surface of the active layer 42 may range from 10 nm to 80 nm. For example, the thickness of the protecting layer 41 may be 100 Å (10 nm), and the thickness of the active layer 42 may be 200 Å (20 nm).

In an exemplary embodiment, the carrier mobility of the active layer 42 ranges from 20 cm$^2$/Vs to 100 cm$^2$/Vs. Because the carrier mobility of the protecting layer 41 is less than the carrier mobility of the active layer 42, and the material of the protecting layer 41 and the material of the semiconductor layer 43 of the driving transistor are the same metal-oxide-semiconductor material, the carrier mobility of the protecting layer 41 and the carrier mobility of the semiconductor layer 43 are equal, and the carrier mobility of the semiconductor layer 43 of the driving transistor is also less than the carrier mobility of the active layer 42 of the switching transistor. For example, the carrier mobility of the semiconductor layer 43 of the driving transistor ranges from 5 cm$^2$/Vs to 30 cm$^2$/Vs.

In an exemplary embodiment, the structure and the projection size of the protecting layer 41 depend on the structure and the projection size of the active layer 42, so that the protecting layer 41 covers one main surface and the side surface of the active layer 42.

As an example, the shape of the projection of the protecting layer 41 on the substrate 1 is the same as the shape of the projection of the active layer 42 on the substrate 1, and the size of the projection of the protecting layer 41 on the substrate 1 is greater than the size of the projection of the active layer 42 on the substrate 1, whereby the protecting layer 41 can at least totally cover and wrap one main surface and the side surface of the active layer 42.

As an example, the shape of the projection of the protecting layer 41 on the substrate 1 is different from the shape of the projection of the active layer 42 on the substrate 1, and the size of the projection of the protecting layer 41 on the substrate 1 is greater than the size of the projection of the active layer 42 on the substrate 1, whereby the protecting layer 41 can at least totally cover and wrap one main surface and the side surface of the active layer 42.

As an example, the active layer 42 includes at least one sublayer. When the active layer 42 includes a plurality of sublayers, in the direction from the active layer 42 pointing to the protecting layer 41, the carrier mobilities of the sublayers of the active layer 42 gradually decrease and approach the carrier mobility of the protecting layer 41, whereby the interface between the active layer 42 and the protecting layer 41 matches.

Figure 3A:
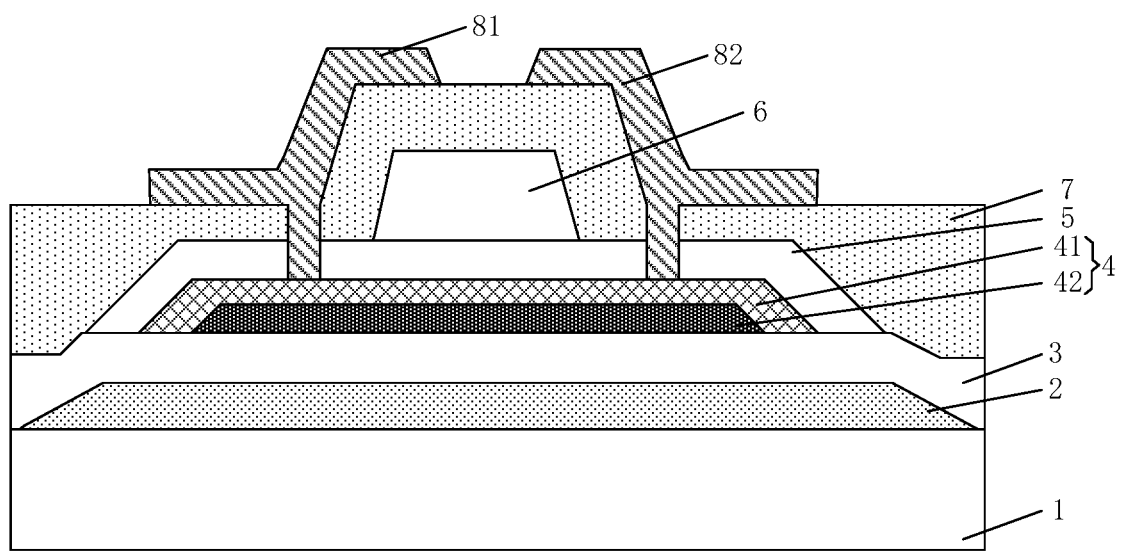
Figure 3B:
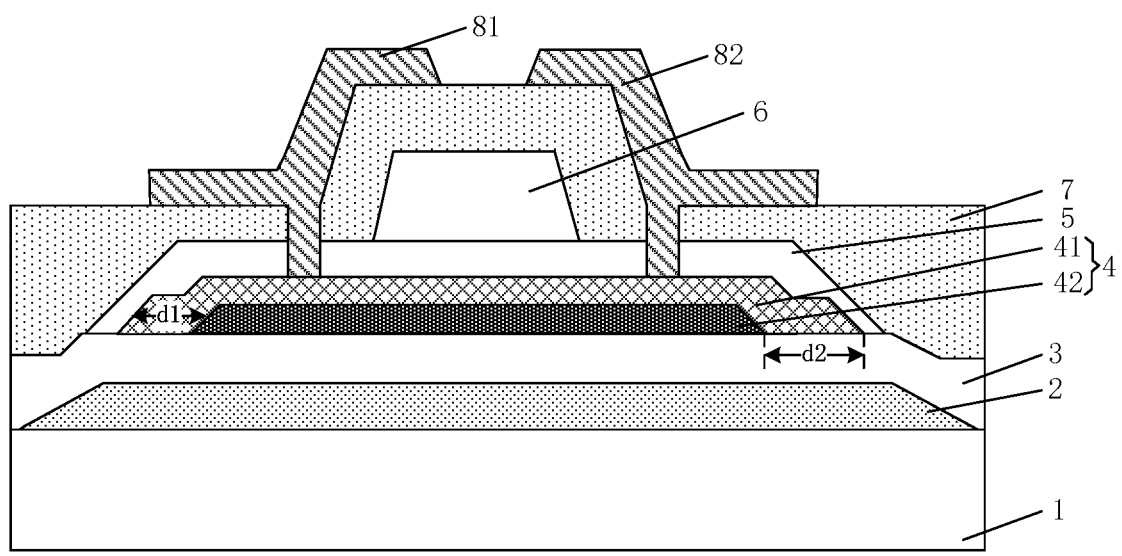
FIG. 3b.

In an exemplary embodiment, referring to the switching transistor shown in FIG. 3b, the protecting layer 41 covers the side surface of the active layer 42 and the main surface of the active layer 42 that is away from the substrate 1, and the part of the orthographic projection of the protecting layer 41 on the substrate 1 that exceeds the orthographic projection of the active layer 42 on the substrate 1 may extend peripherally in the direction parallel to the substrate 1, to increase the thickness of the protecting layer 41 in the direction perpendicular to the side surface of the active layer 42, to improve the effect of the protection by the protecting layer 41 on the side surface of the active layer 42.

In an exemplary embodiment, referring to the switching transistor shown in FIG. 3b, the thickness of part of the area of the protecting layer 41 in the direction perpendicular to the side surface of the active layer 42 is d1, and the thickness of another part of the area of the protecting layer 41 in the direction perpendicular to the side surface of the active layer 42 is d2, wherein d1 and d2 may be unequal. In practical applications, in order to simplify the design, d1 and d2 may be set to be equal.

The above-described arrangement in a same layer refers to that they are fabricated by using a one-step patterning process. The one-step patterning process refers to a process in which the required layer structure is formed by a single exposure. The one-step patterning process includes the processes of masking, exposure, development, etching, stripping and so on.

In addition, the types of the driving transistor and the switching transistor are not limited herein. They may be top-grid-type thin-film transistors, and may also be bottom-grid-type thin-film transistors. The embodiments and the drawings of the present disclosure illustrate by taking the top-grid-type thin-film transistors as an example.

As an example, referring to FIG. 5b, the driving transistor may include a light shielding layer 2, and the light shielding layer 2 of the driving transistor is electrically connected to a source 81.

In practical applications, by electrically connecting the light shielding layer 2 of the driving transistor and the source 81, and subsequently electrically connecting the light shielding layer 2 to the ground, the driving transistor having a good saturability can be obtained.

The meaning of the above-described "good saturability" is that the driving transistor more easily enters the saturation region, thereby entering the state of stable operation. Particularly, FIG. 4b shows a schematic diagram of the comparison between the characteristic curves of a driving transistor provided with the light shielding layer 2 that is earthed and a driving transistor not provided with the light shielding layer 2. It can be seen that, for the driving transistor provided with the light shielding layer 2 that is earthed (with shield), on the condition that the source-drain voltage (Vds) is low, the source-drain current (Ids) tends to be steady, and enters the saturation region. However, for the driving transistor not provided with the light shielding layer 2 (without shield), on the condition that the source-drain voltage (Vds) is high, the source-drain current (Ids) continues increasing, is in the linear region, and is difficult to enter the saturation region.

In practical applications, it may be configured that the driving thin-film transistor is a transistor with a good saturability, its light shielding layer 2 is electrically connected to a first electrode 81 (source electrode), and the light shielding layer 2 is electrically connected to the ground. The switching transistor (the transistor of a high $I_{on}$ demand), according to situations, may not be provided with the light shielding layer 2, or be provided with the light shielding layer 2 for light shielding, which can simplify the design, shorten the fabricating process and reduce the cost. $I_{on}$ refers to the operating current (on-state current) of the transistor.

It should be noted that the array base plate is an Organic Light Emitting Diode (OLED) array base plate, and is used to drive the OLED to emit light, and the array base plate is applied to an OLED display panel.

In the embodiments of the present disclosure, the driving transistor is configured to include the semiconductor layer 43, the switching transistor is configured to include the active layer 42 and the protecting layer 41, the material of the protecting layer 41 and the material of the semiconductor layer 43 are the same metal-oxide-semiconductor material, and they are arranged in a same layer; and the carrier mobility of the active layer 42 is greater than the carrier mobility of the protecting layer 41. It should be noted that, in practical applications, the driving transistor is required to have a better stability, and the switching transistor requires a higher operating current ($I_{on}$). In order to satisfy the requirements of both of them without increasing the difficulty in the fabricating process, in an aspect, it is configured that the material of the protecting layer 41 and the material of the semiconductor layer 43 are the same metal-oxide-semiconductor material, they are arranged in a same layer, and the materials of the protecting layer 41 and the semiconductor layer 43 employ a metal-oxide system of low carrier mobilities, for example, a carrier mobility of 5 $cm^2/Vs$ or 10 $cm^2/Vs$, to prevent abnormality of the driving circuit of the array base plate caused by a poor stability of the driving transistor, and reduce the difficulty in the process for fabricating the array base plate. In another aspect, it is configured that the protecting layer 41 covers one main surface and the side surface of the active layer 42, and the carrier mobility of the active layer 42 is greater than the carrier mobility of the protecting layer 41, which ensures that the switching transistor has a high operating current ($I_{on}$), and, the protection by the protecting layer 41 on the active layer 42 improves the stability of the switching transistor.

In practical applications, when the side surface of the active layer 42 has an undercut, and a controlling voltage is applied to the grid, it might happen to a large extent that an electrically conducting channel is formed at the area of the active layer 42 that is adjacent to the side surface, while the area of the active layer 42 that is located at the center does not form an electrically conducting channel, which causes that the grid voltages required to form the channels by the area adjacent to the side surface and the center area of the active layer 42 are different, to result in a double-channel effect, and deteriorate the usage performance of the transistors. In the present disclosure, by protecting the side surface of the active layer 42, the double-channel effect can be effectively prevented, to improve the performance of the thin-film transistor.

In addition, because the source-drain current (Ids) of a thin-film transistor is negatively correlated with the channel length (L) of the thin-film transistor, and is positively correlated with the channel width (W) and the carrier mobility ($\mu$) of the semiconductor layer, when the magnitude of the required source-drain current (Ids) is constant, if the carrier mobility (u) of the semiconductor layer is greater, it required to provide a greater channel length (L) to maintain the magnitude of the source-drain current (Ids) constant. However, because the driving transistor has a large size itself, the utilization of the metal-oxide system with low carrier mobilities for the driving transistor facilitates to reduce its channel length, thereby reducing the size of the driving transistor, which facilitates to the design of high Pixels Per Inch (PPI) products.

When both of the materials of the active layer 42 and the protecting layer 41 of the switching transistor of the array base plate are a metal-oxide-semiconductor material, as compared with thin-film transistors with a metal oxide and a low-temperature polycrystalline silicon, the process for fabricating the array base plate corresponding to it is simpler, and the fabricating process steps can be reduced from 15 process steps to 10 or 11 process steps, which shortens the fabrication period and reduces the fabrication cost to a large extent. In addition, the display products fabricated by using the metal-oxide thin-film transistor can have the characteristic of low frequencies, which reduces the usage power consumption of the display products.

In some embodiments of the present disclosure, referring to FIG. 3a or FIG. 3b, the switching transistor includes a grid 6 and a grid insulating layer 5. The grid insulating layer 5 is located on the side of the protecting layer 41 that is away from the active layer 42, the grid 6 is located on the side of the grid insulating layer 5 that is away from the substrate 1, and the orthographic projection of the grid 6 on the substrate 1 is located within the orthographic projection of the active layer 42 on the substrate 1.

The "orthographic projection" of the grid 6 on the substrate 1 refers to the projection of the grid 6 on the substrate 1 in the direction perpendicular to the substrate 1. The meanings of the other descriptions relevant to orthographic projections in the present disclosure are similar to that, and are not discussed further.

That the orthographic projection of the grid 6 on the substrate 1 is located within the orthographic projection of the active layer 42 on the substrate 1 means that the contour of the orthographic projection of the grid 6 on the substrate 1 overlaps with the contour of the orthographic projection of the active layer 42 on the substrate 1; or the contour of the orthographic projection of the grid 6 on the substrate 1 is located within the contour of the orthographic projection of the active layer 42 on the substrate 1.

In an exemplary embodiment, molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the grid 6.

In an exemplary embodiment, the thickness of the grid 6 in the direction perpendicular to the substrate 1 may range from 1000 Å to 10000 Å. For example, the thicknesses of the sublayers of the molybdenum/aluminium/molybdenum (Mo/Al/Mo) of a stacked-layer structure are 200 Å/3000 Å/200 Å. The thicknesses of the sublayers of the titanium/aluminium/titanium (Ti/Al/Ti) of a stacked-layer structure are 150/4000/200 Å. The thicknesses of the two sublayers of the molybdenum niobium titanium/copper (MoNiTi/Cu) of a double-layer structure are 200 Å/4000 Å.

In an exemplary embodiment, the thickness of the grid insulating layer 5 in the direction perpendicular to the substrate 1 ranges from 80 nm to 200 nm. The material of the grid insulating layer 5 may be any one of silicon nitride ($SiN_x$), silicon oxide ($SiO_2$) and silicon oxynitride ($SiN_xO_y$).

In some embodiments of the present disclosure, the switching transistor further includes a source 81 and a drain 82. Both of the source 81 and the drain 82 are located on the side of the grid insulating layer 5 that is away from the substrate 1. For example, both of the source 81 and the drain 82 are located on the side of the grid 6 that is away from the substrate 1. Alternatively, both of the source 81 and the drain 82 are arranged in a same layer as the grid 6.

In practical applications, by patterning processing to a source-drain metal layer (SD), the source 81 and the drain 82 are obtained simultaneously. Any one of molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the source-drain metal layer (SD). The thickness of the source-drain metal layer (SD) in the direction perpendicular to the substrate 1 ranges from 1000 Å to 10000 Å.

Figure 4A:
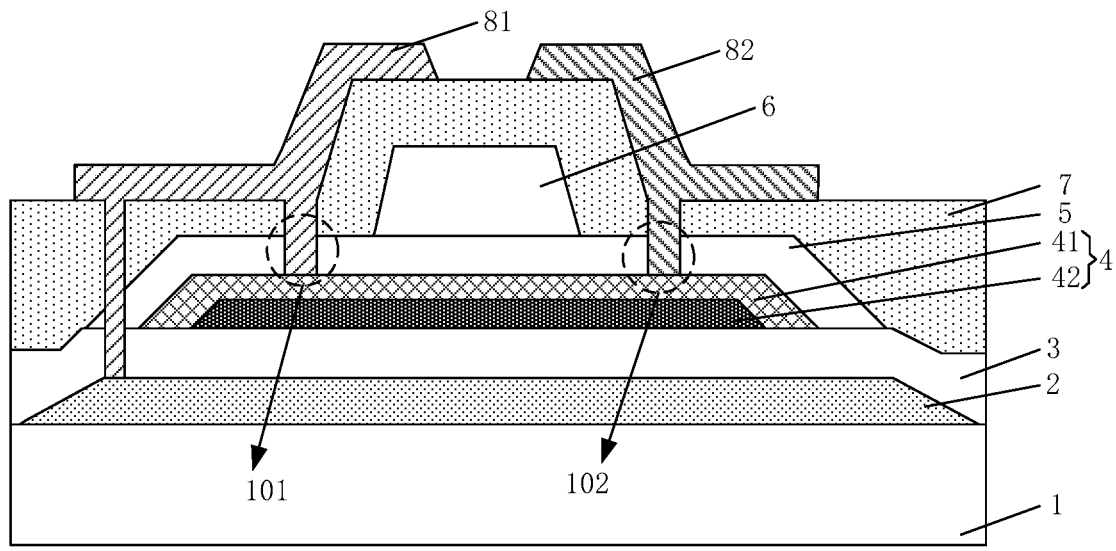
FIG. 4a and FIG. 4c are schematic structural diagrams of four transistors with different structures according to embodiments of the present disclosure.
Figure 4B:
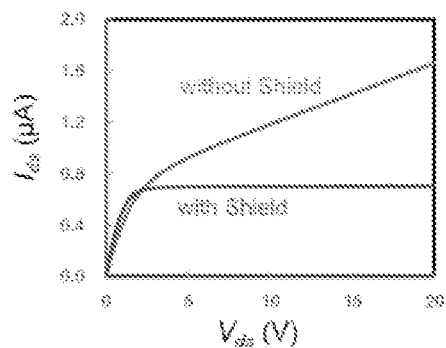
FIG. 4b is a comparison diagram of the I-V characteristic curves of two different driving transistors according to an embodiment of the present disclosure.

Referring to FIG. 4a, the switching transistor has a first connecting hole 101 penetrating the film layers between the source 81 and the protecting layer 41 (the film layers between them are a dielectric layer 7 and the grid insulating layer 5), and a second connecting hole 102 penetrating the film layers between the drain 82 and the protecting layer 41 (the film layers between them are the dielectric layer 7 and the grid insulating layer 5), and the hole bottom of the first connecting hole 101 and the hole bottom of the second connecting hole 102 individually expose part of the area of the protecting layer 41. The source 81 directly contacts the protecting layer 41 via the first connecting hole 101, and the drain 82 directly contacts the protecting layer 41 via the second connecting hole 102.

Because both of the protecting layer 41 and the active layer 42 are of a semiconductor material, by configuring that the source 81 directly contacts one end of the protecting layer 41, and the drain 82 directly contacts the other end of the protecting layer 41, when a voltage is applied to the source 81 and the drain 82, an electric signal may be transmitted to the active layer 42 via the protecting layer 41. That results in a simple design of the switching transistor, reduces the difficulty in the fabricating process, and reduces the cost.

Figure 4C:
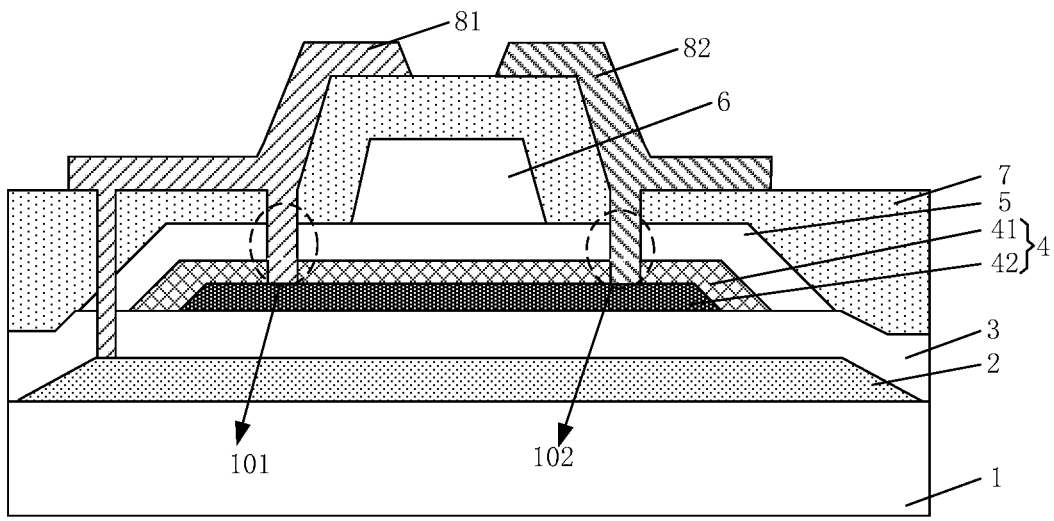

Referring to FIG. 4c, the switching transistor has a first connecting hole 101 penetrating the film layers between the source 81 and the active layer 42 (the film layers between them are the dielectric layer 7, the grid insulating layer 5 and the protecting layer 41), and a second connecting hole 102 penetrating the film layers between the drain 82 and the active layer 42, the hole bottom of the first connecting hole 101 and the hole bottom of the second connecting hole 102 individually expose part of the area of the active layer 42, and the hole wall of the first connecting hole 101 and the hole wall of the second connecting hole 102 individually expose part of the area of the protecting layer 41. The source 81 directly contacts both of the protecting layer 41 and the active layer 42 via the first connecting hole 101, and the drain 82 directly contacts both of the protecting layer 41 and the active layer 42 via the second connecting hole 102.

By configuring that the source 81 directly contacts both of the protecting layer 41 and the active layer 42 via the first connecting hole 101, and the drain 82 directly contacts both of the protecting layer 41 and the active layer 42 via the second connecting hole 102, the voltage signals that are applied by the source 81 and the drain 82 and received by the protecting layer 41 and the active layer 42 can be simultaneously intensified, thereby reducing the contact resistance, and reducing the probability of the double-channel effect (the protecting layer 41 generates a channel under a grid voltage, and the active layer 42 generates a channel under another grid voltage).

In some embodiments of the present disclosure, the material of the grid insulating layer 5 is a light shielding material, and the orthographic projection of the protecting layer 41 on the substrate 1 is located within the orthographic projection of the grid insulating layer 5 on the substrate 1.

By configuring the material of the grid insulating layer 5 to be a light shielding material, when the switching transistor of the array base plate is applied to an OLED display panel, and the light rays reflected or refracted by an OLED luminescent layer between the film layers are irradiated in the direction of the active layer 42 and the protecting layer 41, the grid insulating layer 5 can block the reflected light rays and the refracted light rays that are from the OLED luminescent layer, to prevent changing of the electric performances of the protecting layer 41 and the active layer 42 after they are irradiated by the light rays, thereby improving the stability of the switching transistor.

In addition, it should be noted that, because the orthographic projection of the protecting layer 41 on the substrate 1 is located within the orthographic projection of the grid insulating layer 5 on the substrate 1, and the protecting layer 41 covers the main surface and the side surface of the active layer 42, the orthographic projection of the active layer 42 on the substrate 1 is also located within the orthographic projection of the grid insulating layer 5 on the substrate 1.

In some embodiments of the present disclosure, the switching transistor further includes a light shielding layer 2, the light shielding layer 2 is located between the substrate 1 and the active layer 42, the orthographic projection of the light shielding layer 2 on the substrate 1 covers the orthographic projection of the active layer 42 on the substrate 1, and the orthographic projection of the light shielding layer 2 on the substrate 1 covers the orthographic projection of the protecting layer 41 on the substrate 1.

In practical applications, the substrate 1 usually has a certain light transmittance, and in order to prevent external-environment light rays from irradiating the active layer 42 and the protecting layer 41 via the substrate 1, the light shielding layer 2 is provided between the substrate 1 and the active layer 42, to prevent changing of the electric performances of the protecting layer 41 and the active layer 42 after they are irradiated by the ambient light rays, thereby improving the stability of the switching transistor.

In some embodiments of the present disclosure, the light shielding layer 2 and the grid 6 are electrically connected.

In this case, the switching transistor is of a double-gate structure, wherein the grid 6 serves as a first grid, and the light shielding layer 2 serves as a second grid. That can serve to improve the stability of the switching transistor, and can block the irradiation on the channel region by the light rays, to further improve the performance of the transistor.

In some embodiments of the present disclosure, the switching transistor further includes a dielectric layer 7, the dielectric layer 7 covers the grid 6, and both of the source 81 and the drain 82 are located on the side of the dielectric layer 7 that is away from the substrate 1.

As an example, the dielectric layer 7 (ILD) may be silicon nitride of a monolayer structure, or silicon oxide of a monolayer structure, or a silicon oxide layer and a silicon nitride layer of a double-layer structure, which may be particularly determined according to designs, and is not limited herein.

As an example, the thickness of the dielectric layer 7 (ILD) in the direction perpendicular to the substrate 1 may range from 200 nm to 600 nm.

As an example, the material of the dielectric layer 7 is a light shielding material, and the orthographic projection of the dielectric layer 7 on the substrate 1 covers the orthographic projection of the protecting layer 41 on the substrate 1. By configuring the material of the dielectric layer 7 to be a light shielding material, the reflected light rays and the refracted light rays that are from the OLED luminescent layer can be further blocked, to improve the effect of the light shielding, and prevent changing of the electric performances of the protecting layer 41 and the active layer 42 after they are irradiated by the light rays, thereby further improving the stability of the switching transistor.

An embodiment of the present disclosure provides a metal-oxide thin-film transistor shown in FIG. 3a, FIG. 3b, FIG. 4a and FIG. 4c, located on the substrate 1, wherein the metal-oxide thin-film transistor includes:

an active layer 42 located on the substrate 1, wherein the active layer 42 includes two opposite main surfaces and a side surface that is located between the outer contours of the two main surfaces; and a protecting layer 41, wherein the protecting layer 41 is located on a main surface of the active layer 42 that is away from the substrate 1 and covers the main surface and the side surface.

The material of the protecting layer 41 is a metal-oxide-semiconductor material, and the carrier mobility of the protecting layer 41 is less than the carrier mobility of the active layer 42.

In some embodiments of the present disclosure, the material of the protecting layer 41 and the material of the active layer 42 include metal elements that are at least not totally the same. Alternatively, the material of the protecting layer 41 and the material of the active layer 42 have metal-element molar ratios that are at least not totally the same.

As an example, both of the materials of the protecting layer 41 and the active layer 42 may be the Indium Tin Zinc Oxide, but the composition ratios of the elements corresponding to them are at least partially different.

In some embodiments of the present disclosure, when the carrier mobility of the protecting layer 41 is less than the carrier mobility of the active layer 42, the material of the protecting layer 41 and the material of the active layer 42 include metal elements that are at least not totally the same. For example, the material of the protecting layer 41 is the Indium Gallium Zinc Oxide, and the material of the active layer 42 is the Indium Tin Zinc Oxide.

In some embodiments of the present disclosure, when the carrier mobility of the protecting layer 41 is less than the carrier mobility of the active layer 42, the material of the protecting layer 41 and the material of the active layer 42 have metal-element molar ratios that are at least not totally the same. For example, the material of the active layer 42 is the Indium Gallium Zinc Oxide, wherein the molar ratio of the indium, gallium, zinc and oxygen is 3:1:3:9, and the carrier mobility corresponding to it is greater than or equal to 40 cm$^2$/Vs. The material of the protecting layer 41 is the Indium Gallium Zinc Oxide, wherein the molar ratio of the indium, gallium, zinc and oxygen is 3:3:3:12, and the carrier mobility corresponding to it is 10 cm$^2$/Vs. It should be noted that the meaning of the "at least not totally the same" is "partially the same or totally different".

In an exemplary embodiment, the thicknesses of the active layer 42 and the protecting layer 41 in the direction perpendicular to the substrate may range from 10 nm to 80 nm, and the thickness of the protecting layer 41 in the direction perpendicular to the side surface of the active layer 42 may range from 10 nm to 80 nm. For example, the thickness of the protecting layer 41 may be 100 Å (10 nm), and the thickness of the active layer 42 may be 200 Å (20 nm).

In an exemplary embodiment, the carrier mobility of the active layer 42 ranges from 20 cm$^2$/Vs to 100 cm$^2$/Vs. Because the carrier mobility of the protecting layer 41 is less than the carrier mobility of the active layer 42, and the material of the protecting layer 41 and the material of the semiconductor layer 43 of the driving transistor are the same metal-oxide-semiconductor material, the carrier mobility of the protecting layer 41 and the carrier mobility of the semiconductor layer 43 are equal, and the carrier mobility of the semiconductor layer 43 of the driving transistor is also less than the carrier mobility of the active layer 42 of the switching transistor. For example, the carrier mobility of the semiconductor layer 43 of the driving transistor ranges from 5 cm$^2$/Vs to 30 cm$^2$/Vs.

In an exemplary embodiment, the structure and the projection size of the protecting layer 41 depend on the structure and the projection size of the active layer 42, so that the protecting layer 41 covers one main surface and the side surface of the active layer 42.

As an example, the active layer 42 includes at least one sublayer. When the active layer 42 includes a plurality of sublayers, in the direction from the active layer 42 pointing to the protecting layer 41, the carrier mobilities of the sublayers of the active layer 42 gradually decrease and approach the carrier mobility of the protecting layer 41, whereby the interface between the active layer 42 and the protecting layer 41 matches.

In an exemplary embodiment, referring to the switching transistor shown in FIG. 3b, the protecting layer 41 covers the side surface and the main surface that is away from the substrate 1 of the active layer 42, and the part of the orthographic projection of the protecting layer 41 on the substrate 1 that exceeds the orthographic projection of the active layer 42 on the substrate 1 may extend peripherally in the direction parallel to the substrate 1, to increase the thickness of the protecting layer 41 in the direction perpendicular to the side surface of the active layer 42, to improve the protection effect by the protecting layer 41 on the side surface of the active layer 42.

In an exemplary embodiment, referring to the switching transistor shown in FIG. 3b, the thickness of part of the area of the protecting layer 41 in the direction perpendicular to the side surface of the active layer 42 is d1, and the thickness of another part of the area of the protecting layer 41 in the direction perpendicular to the side surface of the active layer 42 is d2, wherein d1 and d2 may be unequal. In practical applications, in order to simplify the design, d1 and d2 may be set to be equal.

In the embodiments of the present disclosure, it is configured that the protecting layer 41 covers one main surface and the side surface of the active layer 42, and the carrier mobility of the active layer 42 is greater than the carrier mobility of the protecting layer 41, which ensures that the switching transistor has a high operating current ($I_{on}$), and, the protection by the protecting layer 41 on the active layer 42 improves the stability of the switching transistor.

It should be noted that the metal-oxide thin-film transistor may be applied to the switching transistor, and may also be applied to the driving transistor, which is particularly determined according to practical demands. In addition, the metal-oxide thin-film transistor may be applied to any one of a Liquid Crystal Display (LCD) display panel, an OLED display panel, a Mini LED display panel and a Micro LED display panel.

In some embodiments of the present disclosure, the metal-oxide thin-film transistor further includes a grid 6 and a grid insulating layer 5. The grid insulating layer 5 is located on the side of the protecting layer 41 that is away from the active layer 42, the grid 6 is located on the side of the grid insulating layer 5 that is away from the substrate 1, and the orthographic projection of the grid 6 on the substrate 1 is located within the orthographic projection of the active layer 42 on the substrate 1.

The "orthographic projection" of the grid 6 on the substrate 1 refers to the projection of the grid 6 on the substrate 1 in the direction perpendicular to the substrate 1. The meanings of the other descriptions relevant to orthographic projections in the present disclosure are similar to that, and are not discussed further.

That the orthographic projection of the grid 6 on the substrate 1 is located within the orthographic projection of the active layer 42 on the substrate 1 means that the contour of the orthographic projection of the grid 6 on the substrate 1 overlaps with the contour of the orthographic projection of the active layer 42 on the substrate 1; or the contour of the orthographic projection of the grid 6 on the substrate 1 is located within the contour of the orthographic projection of the active layer 42 on the substrate 1.

In an exemplary embodiment, molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the grid 6.

In an exemplary embodiment, the thickness of the grid 6 in the direction perpendicular to the substrate 1 may range from 1000 Å to 10000 Å. For example, the thicknesses of the sublayers of the molybdenum/aluminium/molybdenum (Mo/Al/Mo) of a stacked-layer structure are 200 Å/3000 Å/200 Å. The thicknesses of the sublayers of the titanium/aluminium/titanium (Ti/Al/Ti) of a stacked-layer structure are 150/4000/200 Å. The thicknesses of the two sublayers of the molybdenum niobium titanium/copper (MoNiTi/Cu) of a double-layer structure are 200 Å/4000 Å.

In an exemplary embodiment, the thickness of the grid insulating layer 5 in the direction perpendicular to the substrate 1 ranges from 80 nm to 200 nm. The material of the grid insulating layer 5 may be any one of silicon nitride ($SiN_x$), silicon oxide ($SiO_2$) and silicon oxynitride ($SiN_xO_y$).

In some embodiments of the present disclosure, the metal-oxide thin-film transistor further includes a source 81 and a drain 82. Both of the source 81 and the drain 82 are located on the side of the grid insulating layer 5 that is away from the substrate 1. For example, both of the source 81 and the drain 82 are located on the side of the grid 6 that is away from the substrate 1. Alternatively, both of the source 81 and the drain 82 are arranged in a same layer as the grid 6.

In practical applications, by patterning processing to a source-drain metal layer (SD), the source 81 and the drain 82 are obtained simultaneously. Any one of molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the source-drain metal layer (SD). The thickness of the source-drain metal layer (SD) in the direction perpendicular to the substrate 1 ranges from 1000 Å to 10000 Å.

Referring to FIG. 4a, the metal-oxide thin-film transistor has a first connecting hole 101 penetrating the film layers between the source 81 and the protecting layer 41 (the film layers between them are a dielectric layer 7 and the grid insulating layer 5), and a second connecting hole 102 penetrating the film layers between the drain 82 and the protecting layer 41 (the film layers between them are the dielectric layer 7 and the grid insulating layer 5), and the hole bottom of the first connecting hole 101 and the hole bottom of the second connecting hole 102 individually expose part of the area of the protecting layer 41. The source 81 directly contacts the protecting layer 41 via the first connecting hole 101, and the drain 82 directly contacts the protecting layer 41 via the second connecting hole 102.

Because both of the protecting layer 41 and the active layer 42 are of a semiconductor material, by configuring that the source 81 directly contacts one end of the protecting layer 41, and the drain 82 directly contacts the other end of the protecting layer 41, when a voltage is applied to the source 81 and the drain 82, an electric signal can be transmitted to the active layer 42 via the protecting layer 41. That results in a simple design of the switching transistor, reduces the difficulty in the fabricating process, and reduces the cost.

Referring to FIG. 4c, the metal-oxide thin-film transistor has a first connecting hole 101 penetrating the film layers between the source 81 and the active layer 42 (the film layers between them are the dielectric layer 7, the grid insulating layer 5 and the protecting layer 41), and a second connecting hole 102 penetrating the film layers between the drain 82 and the active layer 42 (the film layers between them are the dielectric layer 7, the grid insulating layer 5 and the protecting layer 41), the hole bottom of the first connecting hole 101 and the hole bottom of the second connecting hole 102 individually expose part of the area of the active layer 42, and the hole wall of the first connecting hole 101 and the hole wall of the second connecting hole 102 individually expose part of the area of the protecting layer 41. The source 81 directly contacts both of the protecting layer 41 and the active layer 42 via the first connecting hole 101, and the drain 82 directly contacts both of the protecting layer 41 and the active layer 42 via the second connecting hole 102.

By configuring that the source 81 directly contacts both of the protecting layer 41 and the active layer 42 via the first connecting hole 101, and the drain 82 directly contacts both of the protecting layer 41 and the active layer 42 via the second connecting hole 102, the voltage signals that are applied by the source 81 and the drain 82 and received by the protecting layer 41 and the active layer 42 can be simultaneously intensified, thereby reducing the contact resistance, and reducing the probability of the double-channel effect (the protecting layer 41 generates a channel under a grid voltage, and the active layer 42 generates a channel under another grid voltage).

In some embodiments of the present disclosure, the material of the grid insulating layer 5 is a light shielding material, and the orthographic projection of the protecting layer 41 on the substrate 1 is located within the orthographic projection of the grid insulating layer 5 on the substrate 1.

By configuring the material of the grid insulating layer 5 to be a light shielding material, when the metal-oxide thin-film transistor is applied to a display panel, and the displaying light rays reflected or refracted between the film layers of the display panel are irradiated in the direction of the active layer 42 and the protecting layer 41, the grid insulating layer 5 can block the reflected light rays and the refracted light rays, to prevent changing of the electric performances of the protecting layer 41 and the active layer 42 after they are irradiated by the light rays, thereby improving the stability of the switching transistor.

In addition, it should be noted that, because the orthographic projection of the protecting layer 41 on the substrate 1 is located within the orthographic projection of the grid insulating layer 5 on the substrate 1, and the protecting layer 41 covers the main surface and the side surface of the active layer 42, the orthographic projection of the active layer 42 on the substrate 1 is also located within the orthographic projection of the grid insulating layer 5 on the substrate 1.

In some embodiments of the present disclosure, the metal-oxide thin-film transistor further includes a light shielding layer 2, the light shielding layer 2 is located between the substrate 1 and the active layer 42, the orthographic projection of the light shielding layer 2 on the substrate 1 covers the orthographic projection of the active layer 42 on the substrate 1, and the orthographic projection of the light shielding layer 2 on the substrate 1 covers the orthographic projection of the protecting layer 41 on the substrate 1.

In practical applications, the substrate 1 usually has a certain light transmittance, and in order to prevent external-environment light rays from irradiating the active layer 42 and the protecting layer 41 via the substrate 1, the light shielding layer 2 is provided between the substrate 1 and the active layer 42, to prevent changing of the electric performances of the protecting layer 41 and the active layer 42 after they are irradiated by the ambient light rays, thereby improving the stability of the switching transistor.

In some embodiments of the present disclosure, the light shielding layer 2 and the grid 6 are electrically connected. In this case, the metal-oxide thin-film transistor is of a double-gate structure, wherein the grid 6 serves as a first grid, and the light shielding layer 2 serves as a second grid. That can serve to improve the stability of the metal-oxide thin-film transistor, and can block the irradiation on the channel region by the light rays, to further improve the performance of the transistor.

In some embodiments of the present disclosure, the metal-oxide thin-film transistor further includes a dielectric layer 7, the dielectric layer 7 covers the grid 6, and both of the source 81 and the drain 82 are located on the side of the dielectric layer 7 that is away from the substrate 1.

As an example, the dielectric layer 7 (ILD) may be silicon nitride of a monolayer structure, or silicon oxide of a monolayer structure, or a silicon oxide layer and a silicon nitride layer of a double-layer structure, which may be particularly determined according to designs, and is not limited herein.

As an example, the thickness of the dielectric layer 7 (ILD) in the direction perpendicular to the substrate 1 may range from 200 nm to 600 nm.

As an example, the material of the dielectric layer 7 is a light shielding material, and the orthographic projection of the dielectric layer 7 on the substrate 1 covers the orthographic projection of the protecting layer 41 on the substrate 1. By configuring the material of the dielectric layer 7 to be a light shielding material, the reflected light rays and the refracted light ray's that are generated by the displaying light rays can be further blocked, to improve the effect of the light shielding, and prevent changing of the electric performances of the protecting layer 41 and the active layer 42 after they are irradiated by the light rays, thereby further improving the stability of the switching transistor.

An embodiment of the present disclosure provides a method for fabricating an array base plate, referring to FIG. 7, the method includes:

S901: providing a substrate 1.

The substrate 1 may be a rigid substrate, for example, a glass. Alternatively, the substrate 1 may be a flexible substrate, for example, polyimide (PI).

S902: forming an active layer 42 of a switching transistor, wherein the active layer 42 includes two opposite main surfaces and a side surface that is located between the outer contours of the two main surfaces.

As an example, the active layer 42 includes at least one sublayer. When the active layer 42 includes a plurality of sublayers, in the direction from the active layer 42 pointing to the protecting layer 41, the carrier mobilities of the sublayers of the active layer 42 gradually decrease and approach the carrier mobility of the protecting layer 41, whereby the interface between the active layer 42 and the protecting layer 41 matches.

S903: forming a semiconductor layer 43 of a driving transistor and a protecting layer 41 of the switching transistor at the same time, wherein the protecting layer 41 is located on a main surface of the active layer 42 that is away from the substrate 1 and covers the main surface and the side surface: the protecting layer 41 and the semiconductor layer 43 are arranged in a same layer, and the material of the protecting layer and the material of the semiconductor layer are the same metal-oxide-semiconductor material; and the carrier mobility of the protecting layer 41 is less than the carrier mobility of the active layer 42.

The above-described arrangement in a same layer refers to that they are fabricated by using a one-step patterning process. The one-step patterning process refers to a process in which the required layer structure is formed by a single exposure. The one-step patterning process includes the processes of masking, exposure, development, etching, stripping and so on.

The driving transistor of the array base plate that is fabricated by using the method for fabricating an array base plate according to the embodiments of the present disclosure includes the semiconductor layer 43, the switching transistor includes the active layer 42 and the protecting layer 41, the material of the protecting layer 41 and the material of the semiconductor layer 43 are the same metal-oxide-semiconductor material, and they are arranged in a same layer; and the carrier mobility of the active layer 42 is greater than the carrier mobility of the protecting layer 41. In practical applications, the driving transistor is required to have a better stability, and the switching transistor requires a greater operating current ($I_{on}$). In order to satisfy the requirements of both of them without increasing the difficulty in the fabricating process, in an aspect, it is configured that the material of the protecting layer 41 and the material of the semiconductor layer 43 are the same metal-oxide-semiconductor material, they are arranged in a same layer, and the materials of the protecting layer 41 and the semiconductor layer 43 employ a metal-oxide system of low carrier mobilities, for example, a carrier mobility of 5 $cm^2$/Vs or 10 $cm^2$/Vs, to prevent abnormality of the driving circuit of the array base plate caused by a poor stability of the driving transistor, and reduce the difficulty in the process for fabricating the array base plate. In another aspect, it is configured that the protecting layer 41 covers one main surface and the side surface of the active layer 42, and the carrier mobility of the active layer 42 is greater than the carrier mobility of the protecting layer 41, which ensures that the switching transistor has a greater operating current ($I_{on}$), and, the protection by the protecting layer 41 on the active layer 42 improves the stability of the switching transistor.

In addition, when the side surface of the active layer 42 has an undercut, and a controlling voltage is applied to the grid, it might happen to a large extent that an electrically conducting channel is formed at the area of the active layer 42 that is adjacent to the side, while the area of the active layer 42 that is located at the center does not form an electrically conducting channel, which causes that the grid voltages required to form the channels by the area adjacent to the side and the center area of the active layer 42 are different, to result in a double-channel effect, and deteriorate the usage performance of the transistors. In the present disclosure, by protecting the side of the active layer 42, the double-channel effect can be effectively prevented, to improve the performance of the thin-film transistor.

The particular structure of the array base plate may refer to the above description, and is not discussed herein further. The methods for fabricating the other components and film layers included in the array base plate may refer to the following detailed description on the fabricating method or the related art.

The method for fabricating an array base plate will be described particularly below by taking the structure shown in FIG. 6 as an example.

S1: providing the substrate 1, and washing the substrate 1.

Figure 8:
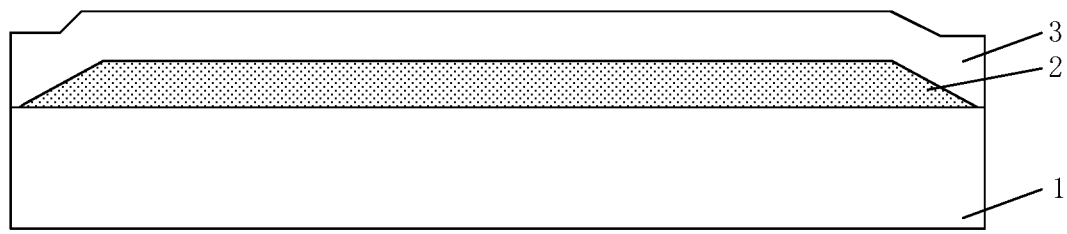
FIGS. 8-12 are schematic diagrams of the intermediate structures of the method for fabricating an array base plate according to an embodiment of the present disclosure.

S2: forming the light shielding layer 2 shown in FIG. 8.

The light shielding layer 2 of the driving transistor and the light shielding layer 2 of the switching transistor are formed at the same time. The light shielding layer 2 is fabricated by using an aluminum/molybdenum metal layer (Al/Mo) of a double-layer structure, a molybdenum metal layer (Mo) of a monolayer structure, a molybdenum niobium metal layer (MoNb) of a monolayer structure or a titanium metal layer of a monolayer structure. The thickness of the light shielding layer 2 may range from 500 Å to 2000 Å.

S3: forming a buffer layer 3 shown in FIG. 8.

The buffer layer 3 of the driving transistor and the buffer layer 3 of the switching transistor are formed at the same time.

The buffer layer 3 may be fabricated by Plasma Enhanced Chemical Vapor Deposition (PECVD) or Plasma Enhanced Atomic Layer Deposition (PEALD).

The material of the buffer layer 3 may be one or more of $SiO_x$, $SiN_x$ and $SiN_xO_y$. For example, the buffer layer 3 is a single $SiO_x$ layer. Alternatively, the buffer layer 3 is a composite film layer formed by a $SiN_x$ layer and a $SiO_x$ layer. The thickness of the buffer layer 3 in the direction perpendicular to the substrate 1 ranges from 2000 Å to 5000 Å, when the buffer layer 3 is a composite film layer formed by a $SiN_x$ layer and a $SiO_x$ layer, the thickness of the $SiN_x$ layer does not exceed 50% of the thickness of the buffer layer 3.

Figure 9:
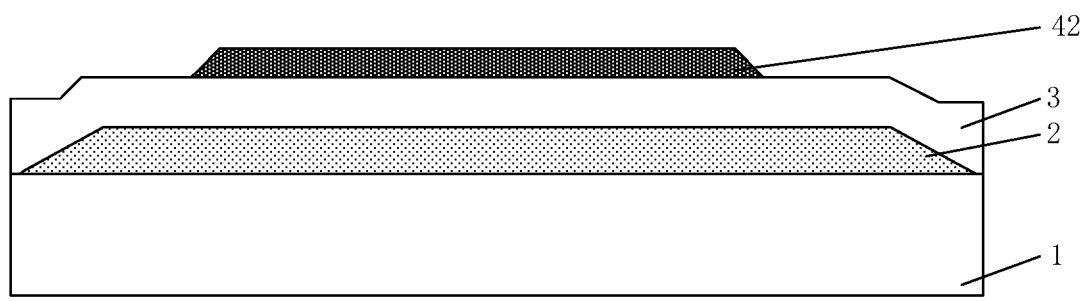

S4: forming the active layer 42 of the driving transistor shown in FIG. 9.

The active layer 42 may be fabricated by sputtering or Atomic Layer Deposition (ALD). The carrier mobility of the active layer 42 ranges from 20 $cm^2/Vs$ to 100 $cm^2/Vs$. The material of the active layer 42 may be a metal-oxide-semiconductor material.

In practical applications, an active thin film is firstly fabricated, and then the array base plate undergoes patterning processing by etching, to obtain the active layer 42 of the driving transistor.

Figure 10:
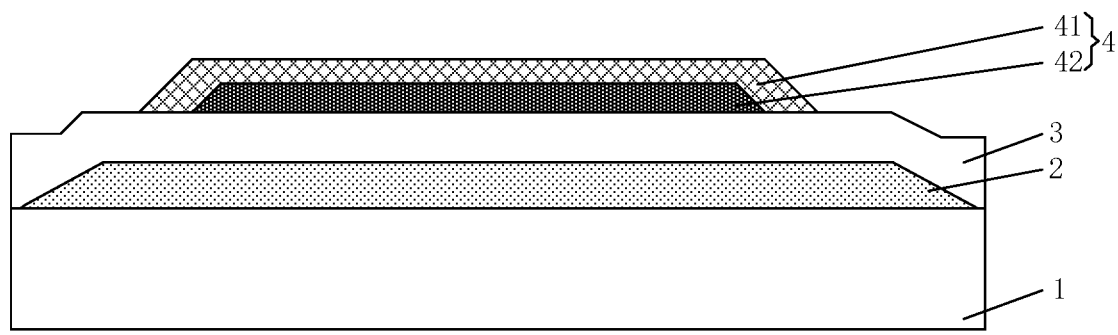

S5: forming the semiconductor layer 43 of the driving transistor and the protecting layer 41 of the switching transistor shown in FIG. 10 at the same time.

The semiconductor layer 43 of the driving transistor and the protecting layer 41 of the switching transistor are fabricated by using the same metal semiconductor oxide. The protecting layer 41 covers the main surface of the active layer 42 that is away from the substrate 1 and the side surface of the active layer 42. The carrier mobility of the active layer 42 is greater than the carrier mobility of the protecting layer 41.

Figure 11:
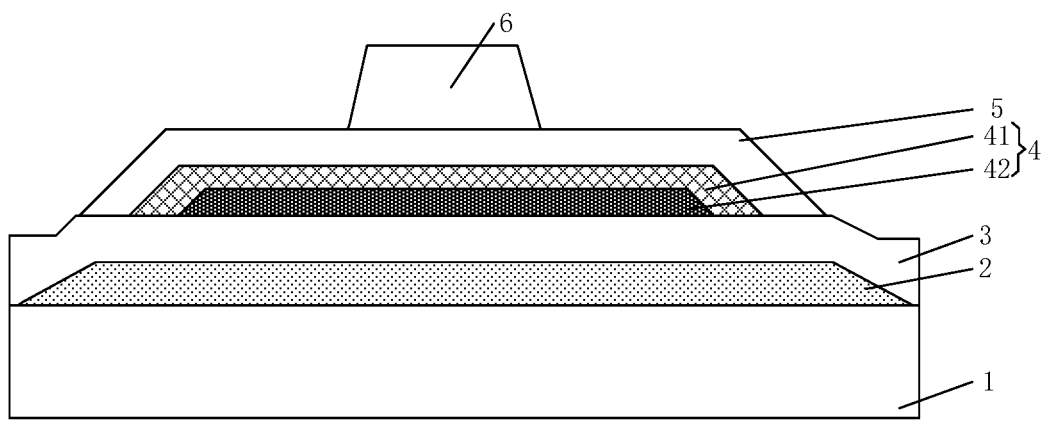

S6: forming the grid insulating layer 5 shown in FIG. 11.

The grid insulating layer 5 of the driving transistor and the grid insulating layer 5 of the switching transistor are simultaneously formed.

For the formation of the grid insulating layer 5, the process may include firstly forming a grid insulating thin film by Chemical Vapor Deposition (CVD), and, subsequently, when the dielectric layer 7 is being formed, performing patterning processing to the grid insulating thin film, to simultaneously form the grid insulating layer 5 and the dielectric layer 7, thereby saving one step of patterning by using a mask. Alternatively, after the grid insulating thin film has been formed, the patterning processing is directly performed, to obtain the grid insulating layer 5.

It should be noted that the whole layer of the grid insulating thin film covers the base plate, and the main object of the patterning processing is to form via holes at some positions of the grid insulating thin film, to obtain the grid insulating layer 5. The grid insulating layer 5 drawn in the drawings according to the embodiments of the present disclosure is merely schematic drawings, and may be particularly adjusted according to practical demands.

S7: forming the grid 6 shown in FIG. 11.

The grid 6 of the driving transistor and the grid 6 of the switching transistor are simultaneously formed.

In an exemplary embodiment, molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the grid 6.

In an exemplary embodiment, the thickness of the grid 6 in the direction perpendicular to the substrate 1 may range from 1000 Å to 10000 Å.

Figure 12:
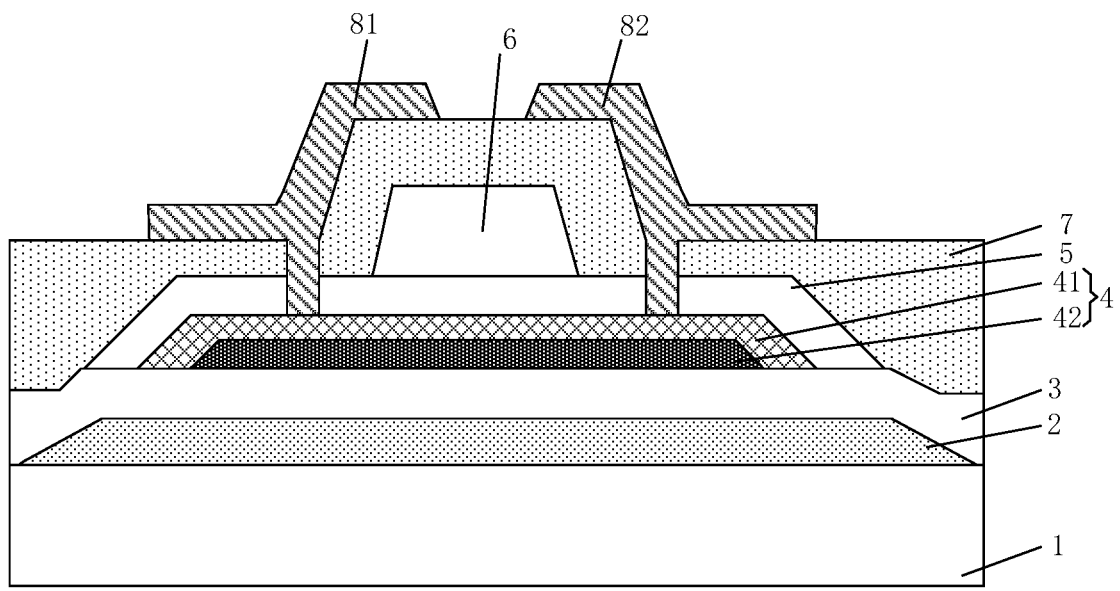

S8: forming the dielectric layer (ILD) 7 shown in FIG. 12.

The dielectric layer 7 of the driving transistor and the dielectric layer 7 of the switching transistor may be simultaneously formed by PECVD. The dielectric layer 7 (ILD) may be silicon nitride ($SiN_x$) of a monolayer structure, or silicon oxide ($SiO_x$) of a monolayer structure, or a double-layer structure formed by a silicon oxide layer ($SiO_x$) and a silicon nitride layer ($SiN_x$), which may be particularly determined according to designs, and is not limited herein. The thickness of the dielectric layer 7 (ILD) in the direction perpendicular to the substrate 1 may range from 200 nm to 600 nm.

S9: forming the source 81 and the drain 82 shown in FIG. 12.

In practical applications, by patterning processing to a source-drain metal layer (SD), the source 81 and the drain 82 of the driving transistor and the source 81 and the drain 82 of the switching transistor are obtained simultaneously. Molybdenum (Mo) of a monolayer structure, molybdenum/aluminum/molybdenum (Mo/Al/Mo) of a stacked-layer structure, titanium/aluminum/titanium (Ti/Al/Ti) of a stacked-layer structure, molybdenum niobium/copper (MoNb/Cu) of a double-layer structure, molybdenum niobium titanium/copper (MoNiTi/Cu) of a double-layer structure or titanium/copper (Ti/Cu) of a double-layer structure may be provided as the source-drain metal layer (SD).

S10: forming a passivation layer (PVX) shown in FIG. 6, wherein the passivation layer covers the driving transistor and the switching transistor.

The passivation layer is formed by deposition by PECVD. The passivation layer may be silicon nitride ($SiN_x$) of a monolayer structure, or silicon oxide (SiOx) of a monolayer structure, or a double-layer structure formed by a silicon oxide layer (SiOx) and a silicon nitride layer ($SiN_x$).

The thickness of the passivation layer in the direction perpendicular to the substrate 1 ranges from 200 nm to 600 nm.

S11: forming a planarization layer (PLN) shown in FIG. 6, wherein the planarization layer covers the passivation layer. In the drawings according to the embodiments of the present disclosure, the passivation layer and the planarization layer are drawn in a simplified manner and are marked as 11.

The material of the planarization layer may be polyimide or an organosilicone material. The organosilicone material may be siloxane. The thickness of the planarization layer in the direction perpendicular to the substrate 1 is 1 μm-3 μm. It should be noted that, in practical applications, the passivation layer and the planarization layer may be obtained simultaneously in one step of patterning processing, to simplify the fabricating process, and save one mask.

S12: forming the anode 9 shown in FIG. 6.

The material of the anode 9 may be indium tin oxide (ITO), or indium tin oxide and silver (Ag). For example, an ITO layer serves as the anode, or a stacked-layer structure of an ITO layer/an Ag layer/an ITO layer serves as the anode. Particularly, the anode 9 may be an ITO layer with a thickness of 40 nm, or an ITO layer with a thickness of 135 nm, or a stacked-layer structure is ITO layer/Ag layer/ITO layer with thicknesses of 70 Å/1000 Å/70 Å. Certainly, the thicknesses may also be regulated according to actual situations, and are not limited herein.

S13: forming a pixel defining layer (PDL) 10 shown in FIG. 6.

The material of the pixel defining layer 10 may be polyimide. The thickness of the pixel defining layer 10 may range from 1 μm to 2 μm.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The invention claimed is:

1. An array base plate, wherein the array base plate comprises:
    a substrate; and
    a driving transistor and a switching transistor that are located on the substrate;
    the driving transistor comprises a semiconductor layer;
    the switching transistor comprises an active layer and a protecting layer, and the active layer comprises two opposite main surfaces and a side surface that is located between outer contours of the two main surfaces;
    the protecting layer is located on a main surface of the active layer that is away from the substrate and covers the main surface and the side surface;
    the protecting layer and the semiconductor layer are arranged in a same layer, and a material of the protecting layer and a material of the semiconductor layer are a same metal-oxide-semiconductor material; and
    a carrier mobility of the protecting layer is less than a carrier mobility of the active layer;
    wherein the switching transistor comprises a grid and a grid insulating layer; and
    the grid insulating layer is located on one side of the protecting layer that is away from the active layer, the grid is located on one side of the grid insulating layer that is away from the substrate, and an orthographic projection of the grid on the substrate is located within an orthographic projection of the active layer on the substrate.

2. The array base plate according to claim 1, wherein the material of the protecting layer and a material of the active layer comprise metal elements that are at least not totally the same; or
    the material of the protecting layer and a material of the active layer have metal-element molar ratios that are at least not totally the same.

3. The array base plate according to claim 1, wherein the switching transistor further comprises a source and a drain;
    both of the source and the drain are located on the side of the grid insulating layer that is away from the substrate;
    the switching transistor is provided with a first connecting hole penetrating the film layers between the source and the protecting layer, and a second connecting hole penetrating the film layers between the drain and the protecting layer, and a hole bottom of the first connecting hole and a hole bottom of the second connecting hole individually expose part of an area of the protecting layer; and
    the source directly contacts the protecting layer via the first connecting hole, and the drain directly contacts the protecting layer via the second connecting hole.

4. The array base plate according to claim 1, wherein the switching transistor further comprises a source and a drain;
    both of the source and the drain are located on the side of the grid insulating layer that is away from the substrate;
    the switching transistor is provided with a first connecting hole penetrating the film layers between the source and the active layer, and a second connecting hole penetrating the film layers between the drain and the active layer, a hole bottom of the first connecting hole and a hole bottom of the second connecting hole individually expose part of an area of the active layer, and a hole wall of the first connecting hole and a hole wall of the second connecting hole individually expose part of an area of the protecting layer; and
    the source directly contacts both of the protecting layer and the active layer via the first connecting hole, and the drain directly contacts both of the protecting layer and the active layer via the second connecting hole.

5. The array base plate according to claim 1, wherein a material of the grid insulating layer is a light shielding material, and an orthographic projection of the protecting layer on the substrate is located within an orthographic projection of the grid insulating layer on the substrate.

6. The array base plate according to claim 1, wherein the switching transistor further comprises a light shielding layer, the light shielding layer is located between the substrate and the active layer, an orthographic projection of the light shielding layer on the substrate covers the orthographic projection of the active layer on the substrate, and the orthographic projection of the light shielding layer on the substrate covers an orthographic projection of the protecting layer on the substrate.

7. The array base plate according to claim 6, wherein the light shielding layer and the grid are electrically connected.

8. The array base plate according to claim 3, wherein the switching transistor further comprises a dielectric layer, the dielectric layer covers the grid, and both of the source and the drain are located on one side of the dielectric layer that is away from the substrate; and
a material of the dielectric layer is a light shielding material, and an orthographic projection of the dielectric layer on the substrate covers an orthographic projection of the protecting layer on the substrate.

9. A metal-oxide thin-film transistor, located on a substrate, wherein the metal-oxide thin-film transistor comprises:
an active layer located on the substrate, wherein the active layer comprises two opposite main surfaces and a side surface that is located between outer contours of the two main surfaces; and
a protecting layer, wherein the protecting layer is located on a main surface of the active layer that is away from the substrate and covers the main surface and the side surface;
wherein, a material of the protecting layer is a metal-oxide-semiconductor material, and a carrier mobility of the protecting layer is less than a carrier mobility of the active layer;
wherein the metal-oxide thin-film transistor further comprises a grid and a grid insulating layer; and
the grid insulating layer is located on one side of the protecting layer that is away from the active layer, the grid is located on one side of the grid insulating layer that is away from the substrate, and an orthographic projection of the grid on the substrate is located within an orthographic projection of the active layer on the substrate.

10. The metal-oxide thin-film transistor according to claim 9, wherein the material of the protecting layer and a material of the active layer comprise metal elements that are at least not totally the same; or
the material of the protecting layer and a material of the active layer have metal-element molar ratios that are at least not totally the same.

11. The metal-oxide thin-film transistor according to claim 9, wherein the metal-oxide thin-film transistor further comprises a source and a drain;
both of the source and the drain are located on the side of the grid insulating layer that is away from the substrate;
the metal-oxide thin-film transistor is provided with a first connecting hole penetrating the film layers between the source and the protecting layer, and a second connecting hole penetrating the film layers between the drain and the protecting layer, and a hole bottom of the first connecting hole and a hole bottom of the second connecting hole individually expose part of an area of the protecting layer; and
the source directly contacts the protecting layer via the first connecting hole, and the drain directly contacts the protecting layer via the second connecting hole.

12. The metal-oxide thin-film transistor according to claim 9, wherein the metal-oxide thin-film transistor further comprises a source and a drain;
both of the source and the drain are located on the side of the grid insulating layer that is away from the substrate;
the metal-oxide thin-film transistor is provided with a first connecting hole penetrating the film layers between the source and the active layer, and a second connecting hole penetrating the film layers between the drain and the active layer, a hole bottom of the first connecting hole and a hole bottom of the second connecting hole individually expose part of an area of the active layer, and a hole wall of the first connecting hole and a hole wall of the second connecting hole individually expose part of an area of the protecting layer; and
the source directly contacts both of the protecting layer and the active layer via the first connecting hole, and the drain directly contacts both of the protecting layer and the active layer via the second connecting hole.

13. The metal-oxide thin-film transistor according to claim 9, wherein a material of the grid insulating layer is a light shielding material, and an orthographic projection of the protecting layer on the substrate is located within an orthographic projection of the grid insulating layer on the substrate.

14. The metal-oxide thin-film transistor according to claim 9, wherein the metal-oxide thin-film transistor further comprises a light shielding layer, the light shielding layer is located between the substrate and the active layer, an orthographic projection of the light shielding layer on the substrate covers the orthographic projection of the active layer on the substrate, and the orthographic projection of the light shielding layer on the substrate covers an orthographic projection of the protecting layer on the substrate.

15. The metal-oxide thin-film transistor according to claim 14, wherein the light shielding layer and the grid are electrically connected.

16. The metal-oxide thin-film transistor according to claim 11, wherein the metal-oxide thin-film transistor further comprises a dielectric layer, the dielectric layer covers the grid, and both of the source and the drain are located on one side of the dielectric layer that is away from the substrate; and
a material of the dielectric layer is a light shielding material, and an orthographic projection of the dielectric layer on the substrate covers an orthographic projection of the protecting layer on the substrate.

17. A method for fabricating an array base plate, wherein the method comprises:
providing a substrate;
forming an active layer of a switching transistor, wherein the active layer comprises two opposite main surfaces and a side surface that is located between outer contours of the two main surfaces; and
forming a semiconductor layer of a driving transistor and a protecting layer of the switching transistor at the same time;
wherein the protecting layer is located on a main surface of the active layer that is away from the substrate and covers the main surface and the side surface;
the protecting layer and the semiconductor layer are arranged in a same layer, and a material of the protecting layer and a material of the semiconductor layer are a same metal-oxide-semiconductor material; and
a carrier mobility of the protecting layer is less than a carrier mobility of the active layer;
wherein the switching transistor further comprises a dielectric layer, the dielectric layer covers the grid, and both of the source and the drain are located on one side of the dielectric layer that is away from the substrate; and a material of the dielectric layer is a light shielding material, and an orthographic projection of the dielectric layer on the substrate covers an orthographic projection of the protecting layer on the substrate.

* * * * *